(12) United States Patent
Kim et al.

(10) Patent No.: US 11,688,886 B2
(45) Date of Patent: *Jun. 27, 2023

(54) THREE DIMENSIONAL ALL-SOLID-STATE LITHIUM ION BATTERY AND METHOD OF FABRICATING THE SAME

(71) Applicant: Samsung Electronics Co., Ltd., Suwon-si (KR)

(72) Inventors: Kyounghwan Kim, Seoul (KR); Sungjin Lim, Suwon-si (KR); Hwiyeol Park, Ansan-si (KR); Jin S. Heo, Hwaseong-si (KR); Hojung Yang, Suwon-si (KR); Huisu Jeong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 260 days.

This patent is subject to a terminal disclaimer.

(21) Appl. No.: 16/951,222

(22) Filed: Nov. 18, 2020

(65) Prior Publication Data

US 2021/0091419 A1 Mar. 25, 2021

Related U.S. Application Data

(63) Continuation of application No. 15/415,194, filed on Jan. 25, 2017, now Pat. No. 10,847,845.

(30) Foreign Application Priority Data

Sep. 1, 2016 (KR) .................. 10-2016-0112675

(51) Int. Cl.
*H01M 4/131* (2010.01)
*H01M 4/136* (2010.01)
(Continued)

(52) U.S. Cl.
CPC ..... *H01M 10/4235* (2013.01); *C23C 14/0623* (2013.01); *C23C 14/08* (2013.01);
(Continued)

(58) Field of Classification Search
CPC .... H01M 4/131; H01M 4/136; H01M 4/1391; H01M 4/1397; H01M 4/505;
(Continued)

(56) References Cited

U.S. PATENT DOCUMENTS

2004/0106037 A1 6/2004 Cho et al.
2006/0194711 A1 8/2006 Son et al.
(Continued)

FOREIGN PATENT DOCUMENTS

JP 2015210970 A 11/2015
KR 1020150133376 A 11/2015

OTHER PUBLICATIONS

Jeong et al., "Investigation of interfacial resistance between LiCoO2 cathode and LiPON electrolyte in the thin film battery", Journal of Power Sources, 159, 2006, pp. 223-226.
(Continued)

*Primary Examiner* — Eugenia Wang
(74) *Attorney, Agent, or Firm* — Cantor Colburn LLP

(57) ABSTRACT

A three-dimensional all-solid-state lithium ion batteries including a cathode protection layer, the battery including: a cathode including a plurality of plates which are vertically disposed on a cathode current collector; a cathode protection layer disposed on a surfaces of the cathode and the cathode current collector; a solid state electrolyte layer disposed on the cathode protection layer; an anode disposed on the solid state electrolyte layer; and an anode current collector disposed on the anode, wherein the cathode protection layer is between the cathode and the solid state electrolyte layer, and
(Continued)

wherein the solid state electrolyte layer is between the cathode protection layer and the anode.

16 Claims, 5 Drawing Sheets

(51) Int. Cl.
| | |
|---|---|
| H01M 4/1397 | (2010.01) |
| H01M 4/62 | (2006.01) |
| H01M 4/1391 | (2010.01) |
| H01M 4/505 | (2010.01) |
| H01M 4/525 | (2010.01) |
| H01M 4/58 | (2010.01) |
| H01M 10/0525 | (2010.01) |
| H01M 10/0562 | (2010.01) |
| H01M 4/485 | (2010.01) |
| H01M 10/42 | (2006.01) |
| C23C 16/30 | (2006.01) |
| C23C 16/40 | (2006.01) |
| H01M 50/431 | (2021.01) |
| C23C 14/06 | (2006.01) |
| C23C 14/08 | (2006.01) |
| C23C 14/34 | (2006.01) |
| C23C 16/455 | (2006.01) |
| H01M 4/38 | (2006.01) |

(52) U.S. Cl.
CPC ............ *C23C 14/34* (2013.01); *C23C 16/305* (2013.01); *C23C 16/40* (2013.01); *C23C 16/45525* (2013.01); *H01M 4/131* (2013.01); *H01M 4/136* (2013.01); *H01M 4/1391* (2013.01); *H01M 4/1397* (2013.01); *H01M 4/505* (2013.01); *H01M 4/525* (2013.01); *H01M 4/5825* (2013.01); *H01M 4/62* (2013.01); *H01M 10/0525* (2013.01); *H01M 10/0562* (2013.01); *H01M 50/431* (2021.01); *H01M 4/382* (2013.01); *H01M 4/485* (2013.01); *H01M 2300/0068* (2013.01); *H01M 2300/0071* (2013.01)

(58) Field of Classification Search
CPC ...... H01M 4/525; H01M 4/5825; H01M 4/62; H01M 4/485; H01M 10/0525; H01M 10/0562; H01M 50/431; H01M 2300/0068; H01M 2300/0071
See application file for complete search history.

(56) References Cited

U.S. PATENT DOCUMENTS

| | | |
|---|---|---|
| 2009/0170001 A1 | 7/2009 | Roozeboom et al. |
| 2012/0040233 A1 | 2/2012 | Kim et al. |
| 2013/0136973 A1 | 5/2013 | Shenoy et al. |
| 2015/0207171 A1 | 7/2015 | Chang et al. |
| 2016/0164064 A1 | 6/2016 | Lahiri et al. |

OTHER PUBLICATIONS

Wang et al., "In Situ STEM-EELS Observation of Nanoscale Interfacial Phenomena in All-Solid-State Batteries", Nano Letters, 16, 2016, 3760-3767.

THREE DIMENSIONAL ALL-SOLID-STATE LITHIUM ION BATTERY AND METHOD OF FABRICATING THE SAME

CROSS-REFERENCE TO RELATED APPLICATION

This application is a continuation of U.S. patent application Ser. No. 15/415,194, issued as U.S. Pat. No. 10,847,845, and claims priority to and the benefit of Korean Patent Application No. 10-2016-0112675, filed on Sep. 1, 2016, in the Korean Intellectual Property Office, and all the benefits accruing therefrom under 35 U.S.C. § 119, the contents of which are incorporated herein in their entirety by reference.

BACKGROUND

1. Field

The present disclosure relates to three dimensional all-solid-state lithium ion batteries and methods of fabricating the same.

2. Description of the Related Art

Recently, in order to realize a high capacity battery, a 3-dimensional lithium ion battery has been developed.

An all-solid-state lithium ion battery includes a cathode and an anode and a solid state electrolyte between the cathode and the anode. There remains a need for an improved all-solid-state lithium ion battery configuration.

SUMMARY

Provided is a three-dimensional (3D) all-solid-state lithium ion battery including a cathode protection layer between a cathode and a solid state electrolyte and methods of manufacturing the 3D all-solid-state lithium ion battery.

Additional aspects will be set forth in part in the description which follows and, in part, will be apparent from the description.

According to an aspect of an embodiment, a 3D all-solid-state lithium ion battery including a cathode protection layer includes: a cathode including a plurality of plates which are vertically disposed on a cathode current collector; a cathode protection layer disposed on a surface of the cathodes and on the cathode current collector; a solid state electrolyte layer disposed on the cathode protection layer; an anode disposed on the solid state electrolyte layer; and an anode current collector disposed on the anode, wherein the cathode protection layer is between the cathode and the solid state electrolyte layer, and wherein the solid state electrolyte layer is between the cathode protection layer and the anode.

A first part of the cathode protection layer contacting the surface of the cathode may include a solid solution formed by a reaction with the surface of the cathode.

The cathode protection layer may include a metal oxide including Al, Si, Ti, Zr, Sn, Mg, or Ca.

The cathode protection layer may have a thickness in a range from about 3 nanometers (nm) to about 20 nm.

The cathodes may further include a base unit that connects lower sides of the plates, and the cathode protection layer may include a solid solution formed by a reaction with the surfaces of the cathodes.

The solid state electrolyte layer may include an oxide group lithium ion conductor or a sulfide group lithium ion conductor.

The cathode protection layer may include the same material as the solid state electrolyte layer.

The cathode protection layer may be formed by a sputtering process and the solid state electrolyte layer may be formed by a chemical vapor deposition (CVD) process.

The cathode protection layer may have a thickness in a range from about 0.1 micrometer (μm) to about 0.5 μm.

The cathode may include $LiCoO_2$, $LiMnO_2$, $LiNiO_2$, $LiFePO_4$, $LiMnPO_4$, $LiMn_2O_4$, $Li(Ni_xCo_yAl_z)O_2$ wherein, $x+y+z=1$, $Li(Ni_xCo_yMn_z)O_2$ wherein $x+y+z=1$, or a combination thereof.

According to an aspect of another embodiment, provided is a method of manufacturing a three-dimensional all-solid-state lithium ion battery including a cathode protection layer, the method including: disposing a cathode on an upper surface of a cathode current collector, the cathode including a plurality of plates; forming the cathode protection layer on the cathode current collector to cover the cathode; forming a solid state electrolyte layer covering the cathode protection layer; forming an anode covering the solid state electrolyte layer; and forming an anode current collector on the anode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
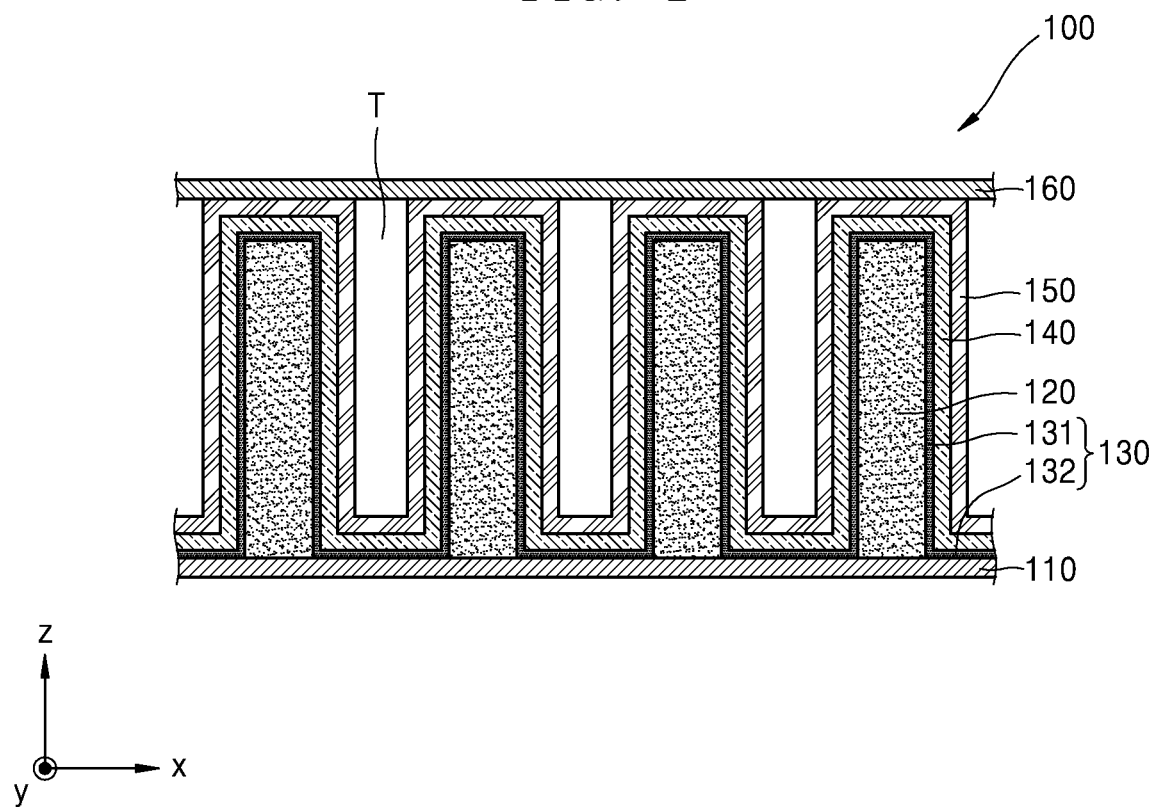
FIG. 1 is a cross-sectional view of a structure of an embodiment of a three-dimensional (3D) all-solid-state lithium ion battery including a cathode protection layer.

Hereafter, the invention will be described more fully with reference to the accompanying drawings, in which exemplary embodiments are shown. In the drawings, thicknesses of layers and regions may be exaggerated for clarity of layers and regions. The embodiments are capable of various modifications and may be embodied in many different forms. Like reference numerals refer to like elements throughout.

It will be understood that when an element or layer is referred to as being "on" another element or layer, the element or layer may be directly on another element or layer or intervening elements or layers. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region,"

"layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a solid state electrolyte layer is deposited on a three-dimensional (3D) cathode having a high aspect ratio, the composition of a precursor of the solid state electrolyte is varied according to the vertical location of the precursor at the cathode, and the intensity and retention time of nitrogen plasma are different, and thus, a solid state electrolyte layer having a non-uniform lithium composition may be formed. When the solid state electrolyte layer is formed, lithium ions from the cathode may move to regions of the solid state electrolyte where the lithium composition is insufficient. Accordingly, a lithium deficient region in the cathode may be formed. If the lithium deficient cathode is used in a lithium ion battery, reversible capacity is reduced and an interfacial resistance between the cathode and the solid state electrolyte is increased, thereby reducing the capacity of the battery. Also, degradation of the lithium ion battery may be accelerated.

FIG. 1 is a cross-sectional view of a structure of a three-dimensional (3D) all-solid-state lithium ion battery 100 including a cathode protection layer according to an embodiment.

Referring to FIG. 1, a plurality of cathodes 120 are vertically disposed, e.g., formed, with respect to an upper surface of a cathode current collector 110. The cathodes 120 may have a plate shape. That is, the cathodes 120 may extend in a y direction. However, the current embodiment is not limited thereto, that is, the cathodes 120 may have a circular shape or a rectangular shape, or may be disposed in an array when viewed in a plan view. Also, the cathodes 120 may be disposed in a lattice shape when viewed in a plan view.

A cathode protection layer 130 is deposited on the cathode current collector 110 to cover the cathodes 120. The cathode protection layer 130 may be formed by a chemical vapor deposition (CVD) method or an atomic layer deposition (ALD) method. The cathode protection layer may be disposed, e.g., cover, an exposed surface of the cathode, e.g., a surface of the cathode extending from the cathode current collector, such as a surface of the cathode that is between the cathode current collector and the anode current collector. The cathode protection layer may be disposed directly on the cathode current collector. Also, the cathode protection layer may not be disposed on a surface of the cathode which is directly on the cathode current collector.

A solid state electrolyte layer 140 and an anode 150 are sequentially disposed on, e.g., formed on, the cathode protection layer 130. The solid state electrolyte layer may cover the cathode protection layer. An anode current collector 160 may be disposed on the anode 150. Trenches T formed between the anode 150 and the anode current collector may be used as spaces for expansion of the 3D all-solid-state lithium ion battery 100. The anode current collector 160 may be disposed, e.g., formed, parallel to the cathode current collector 110.

The anode current collector 160 may include a conductive metal, such as Cu, Au, Pt, Ag, Zn, Al, Mg, Ti, Fe, Co, Ni, Ge, In, Pd, or a combination thereof. The cathode current collector 110 may be in the form of a plate. The cathode current collector 110 may have a thickness in a range from about 1 micrometer (μm) to about 15 μm.

The cathode 120 may include a cathode active material. The cathode 120 may be formed by sintering a cathode-forming material that includes cathode active material powder, a binder, and a plasticizer. In the process of sintering the cathode-forming material, the plasticizer and the binder may be evaporated, and thus, the cathode 120 may include only the cathode active material.

The cathode 120 may include a lithium transition metal oxide. For example, the cathode 120 may include $LiCoO_2$, $LiMnO_2$, $LiNiO_2$, $LiFePO_4$, $LiMnPO_4$, $LiMn_2O_4$, $Li(Ni_xCo_yAl_z)O_2$ wherein x+y+z=1, or $Li(Ni_xCo_yMn_z)O_2$ wherein x+y+z=1, or a combination thereof.

The cathode 120 according to an embodiment may have a thickness in a range from about 5 μm to about 30 μm. The thickness of the cathode 120 is shown as a width of the cathode 120 in FIG. 1. If the thickness of the cathode 120 is less than 5 μm, the energy density of a 3D lithium ion secondary battery having the cathode 120 may be significantly reduced. If the thickness of the cathode 120 is greater than 30 μm, the improvement in energy density is significantly reduced and the charge/discharge speed is reduced.

While not wanting to be bound by theory, it is understood that the cathode protection layer 130 prevents lithium from moving from the cathode 120 to the solid state electrolyte layer 140 in the process of depositing the solid state electrolyte layer 140. The cathode protection layer 130 may include a metal oxide of Al, Si, Ti, Zr, Sn, Mg, Ca, or a combination thereof.

The cathode protection layer 130 may have a thickness in a range from about 3 nanometers (nm) to about 20 nm. If the thickness of the cathode protection layer 130 is greater than 20 nm, an interfacial resistance by the cathode protection layer 130 is increased. If the thickness of the cathode protection layer 130 is less than 3 nm, the thickness of a lithium reduction region of the cathode 120 is increased, and accordingly, the charge/discharge efficiency of the lithium ion battery is reduced.

The cathode protection layer 130 includes a first part 131 and a second part 132. The first part 131 of the cathode protection layer 130 contacts the cathode 120 and the second part 132 of the cathode protection layer 130 contacts the cathode current collector 110. The first part 131 may react with the cathode 120 in a process of heat treatment, and accordingly, the first part 131 may be changed as a solid solution by a reaction with a material on a surface of the cathode 120. For example, if the cathode 120 includes $LiCoO_2$ and the cathode protection layer 130 includes $Al_2O_3$, the solid solution may comprise, e.g., consist of, $LiCo_{1-x}Al_xO_2$. The whole first part 131 or some portion of the first part 131 may become the solid solution according to the thickness of the first part 131 and the temperature and time of the heat treatment. The surface of the cathode 120 may also become the solid solution by a reaction with the first part 131 of the cathode protection layer 130.

The solid state electrolyte layer 140 may have a thickness in a range from about 0.5 μm to about 1 μm. The solid state electrolyte layer 140 may include an oxide group lithium ion conductor or a sulfide group lithium ion conductor. The oxide group lithium ion conductor may include, for example, $Li_{0.33}La_{0.56}TiO_3$ (LLTO), $Li_{1.2}Ti_{1.7}Al_{0.3}(PO_4)_3$ (LATP), $Li_{2.9}PO_{3.3}N_{0.46}$ (LiPON), or a combination thereof.

The sulfide group lithium ion conductor may include, for example, $L_{3.25}Ge_{0.25}P_{0.75}S_4$ (LGPS), $Li_3PS_4$, $Li_4GeS_4$, or a combination thereof. The solid state electrolyte layer 140 may be formed by a CVD process.

The anode 150 may include lithium. The anode 150 may be formed by sputtering or thermally evaporating lithium. The anode 150 may have a thickness in a range from about 50 nm to about 1 μm.

The anode current collector 160 may be in a form of a thin metal film. The anode current collector 160 may include, for example, copper, stainless steel, nickel, aluminum, and titanium. The anode current collector 160 may have a thickness of approximately 2 μm.

The disclosed embodiment is not limited to the above descriptions. For example, the cathode protection layer 130 may include the same material as the solid state electrolyte layer 140. In this case, a thickness of the cathode protection layer 130 may be in a range from about 0.1 μm to about 0.5 μm and may be provided by sputtering, for example. The solid state electrolyte layer 140 may be formed by a CVD process. When the cathode protection layer 130 and the solid state electrolyte layer 140 include the same material, the process of manufacturing a lithium ion battery may be facilitated. Also, an interfacial resistance between the cathode protection layer 130 formed by a sputtering process and the cathode 120 may be reduced and a stable charge/discharge may be achieved. The solid state electrolyte layer 140 formed by a CVD process may compensate for a non-uniform coverage of the sputtered cathode protection layer 130.

In the 3D all-solid-state lithium ion battery 100, and while not wanting to be bound by theory, since the cathode protection layer 130 prevents lithium from moving from the cathode 120 to the solid state electrolyte layer 140 during depositing the solid state electrolyte layer 140 in the process of manufacturing the 3D all-solid-state lithium ion battery 100, the performance of the 3D all-solid-state lithium ion battery 100 is increased, and also, the lifetime of the 3D all-solid-state lithium ion battery 100 is increased.

Figure 2:
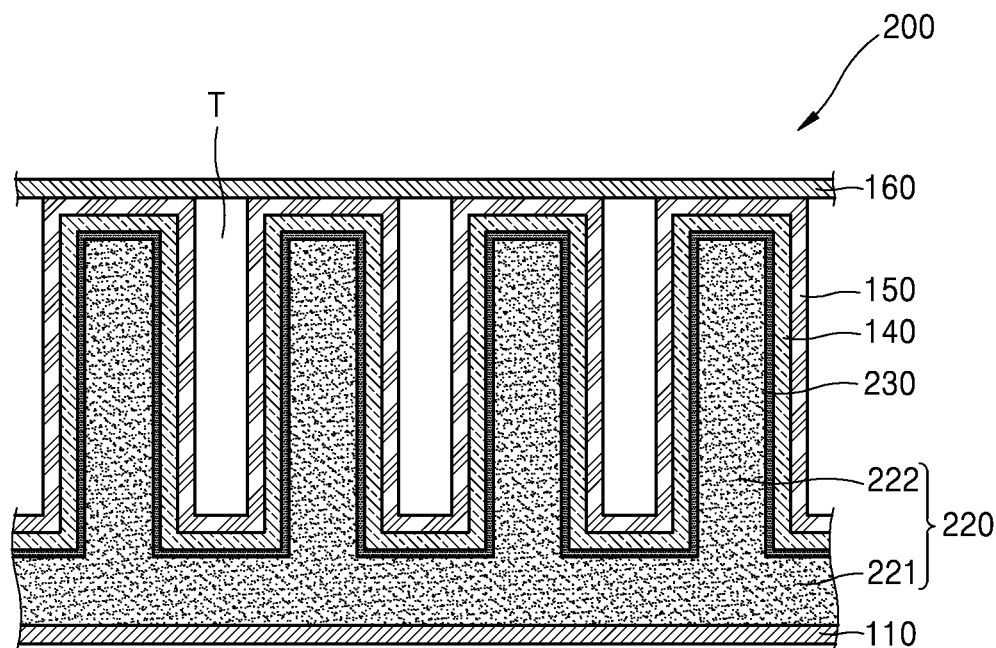
FIG. 2 is a cross-sectional view of a structure of another embodiment of a 3D all-solid-state lithium ion battery including a cathode protection layer.

FIG. 2 is a cross-sectional view of a structure of a 3D all-solid-state lithium ion battery 200 including a cathode protection layer according to another embodiment. Like reference numerals are used for elements that are substantially identical to the elements of the 3D all-solid-state lithium ion battery 100 of FIG. 1, and the descriptions thereof will not be repeated.

Referring to FIG. 2, a cathode 220 is formed on a cathode current collector 110. The cathode 220 includes a base unit 221 and a plurality of plates 222. After disposing, e.g., arranging, the plates 222 on the base unit 221, the cathode 220 may be disposed, e.g., formed by sintering the resulting product.

However, the disclosed embodiment is not limited thereto. For example, the plates 222 of the cathode 220 may have a circular shape or a rectangular shape when viewed from a plan view, or may be arranged in an array. Also, the plates 222 of the cathode 220 may have a lattice shape when viewed in a plan view.

A cathode protection layer 230 is deposited on the cathode 220. The cathode protection layer 230 may be formed by a CVD process or an ALD process.

A solid state electrolyte layer 140 and an anode 150 may be sequentially formed on the cathode protection layer 230. An anode current collector 160 may be formed on the anode 150.

The cathode protection layer 230 protects lithium from moving from the cathode 220 to the solid state electrolyte layer 140 in a process of depositing the solid state electrolyte layer 140. The cathode protection layer 230 may have a thickness in a range from about 3 nm to about 20 nm.

The cathode protection layer 230 may react with a material on a surface of the cathode 220, and accordingly, a solid solution may be formed by a reaction between the cathode protection layer 230 and the cathode 220. For example, if the cathode 220 includes $LiCoO_2$ and the cathode protection layer 230 includes $Al_2O_3$, the solid solution may be $LiCo_{1-x}Al_xO_2$. The whole cathode protection layer 230 or some portion of the cathode protection layer 230 may become the solid solution according to the thickness of the cathode protection layer 230 and the temperature and time of the heat treatment. The surface of the cathode 220 that contacts the cathode protection layer 230 may also become the solid solution.

The 3D all-solid-state lithium ion battery 200 may be stably manufactured in the manufacturing process since the plates are fixed on a base unit.

FIGS. 3A through 3D are cross-sectional views illustrating a method of manufacturing a 3D all-solid-state lithium ion battery 100 including the cathode protection layer 130 according to an embodiment. Like reference numerals are used for elements that are substantially identical to the elements of the 3D all-solid-state lithium ion battery 100, and the descriptions thereof will not be repeated.

Figure 3A:
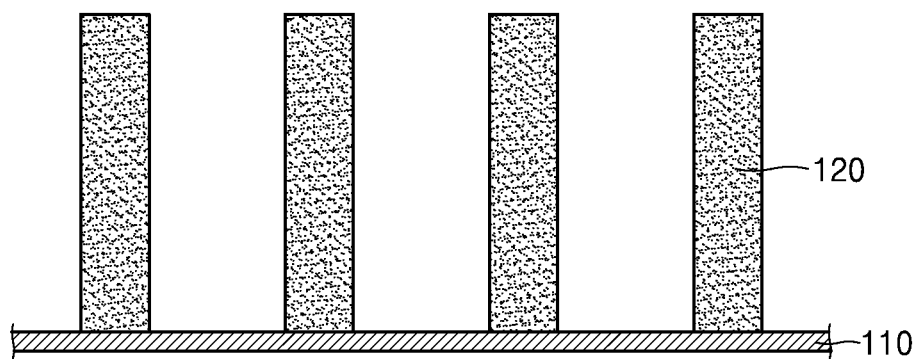
FIGS. 3A through 3D are cross-sectional views illustrating an embodiment of a method of manufacturing a 3D all-solid-state lithium ion battery including a cathode protection layer.

Referring to FIG. 3A, the cathodes 120 are vertically disposed on the cathode current collector 110. The cathodes 120 may include only a cathode active material. The cathodes 120 may be formed by sintering a cathode-forming material including cathode active material powder, a binder, and a plasticizer. In the process of sintering the cathode-forming material, the binder and the plasticizer may be evaporated, and accordingly, the cathodes 120 including only the cathode active material may be obtained. The cathodes 120 may have a plate shape. The cathodes 120 may have a thickness in a range from about 5 μm to about 30 μm.

Figure 3B:
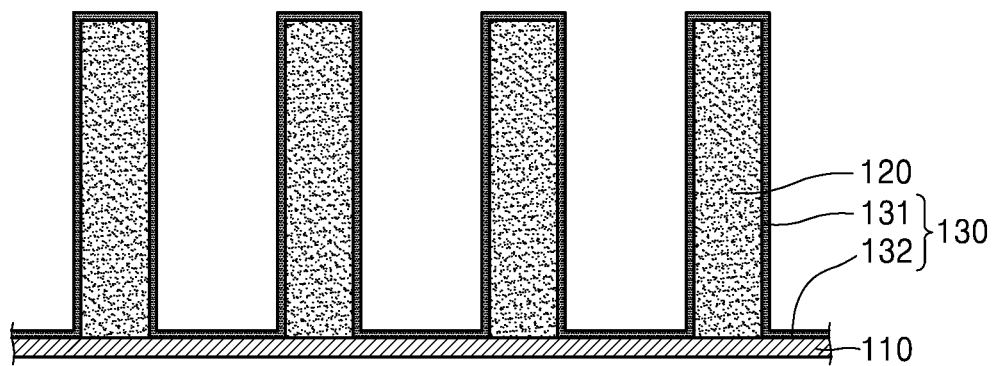

Referring to FIG. 3B, the cathode protection layer 130 is formed on the cathode current collector 110 to cover the cathodes 120. The cathode protection layer 130 may be formed by an ALD process. The cathode protection layer 130 may include a metal oxide including Al, Si, Ti, Zr, Sn, Mg, Ca, or a combination thereof. The cathode protection layer 130 may have a thickness in a range from about 3 nm to about 20 nm.

Next, the resultant product is heat treated. For example, if the resulting product is heat treated for 5 hours at a temperature of 450° C., the cathode protection layer 130 in contact with the cathodes 120 forms the first part 131 consisting of a solid solution by a reaction with surfaces of the cathodes 120. The cathode protection layer 130 includes a second part 132 that is not in contact with the cathodes 120. If the cathodes 120 include $LiCoO_2$ and the cathode protection layer 130 includes $Al_2O_3$, the solid solution may be $LiCo_{1-x}Al_xO_2$. The whole first part 131 or some portion of the first part 131 may become the solid solution according to the thickness of the first part 131 and the temperature and time of the heat treatment. In the process of heat treatment, surfaces of the cathodes 120 may also become the solid solution.

Figure 3C:
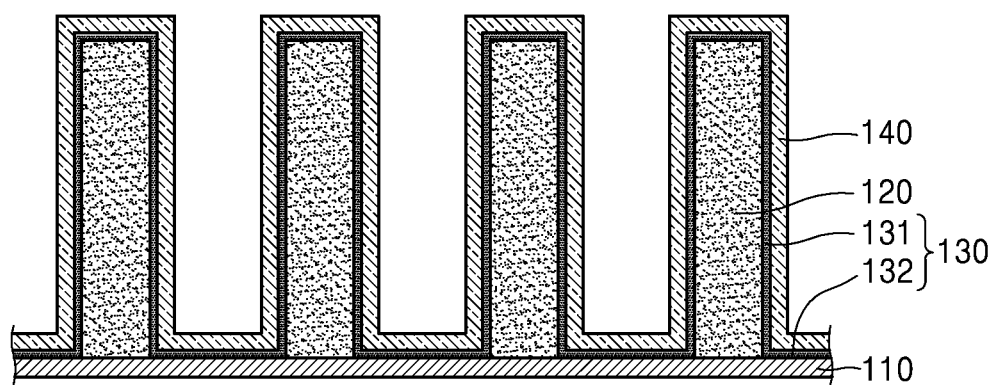

Referring to FIG. 3C, the solid state electrolyte layer 140 is formed on the cathode protection layer 130. The solid state electrolyte layer 140 may be formed by a CVD process or an ALD process. The solid state electrolyte layer 140 may have a thickness in a range from about 0.5 μm to about 1 μm. The solid state electrolyte layer 140 may include an oxide group lithium ion conductor or a sulfide group lithium ion conductor.

Figure 3D:
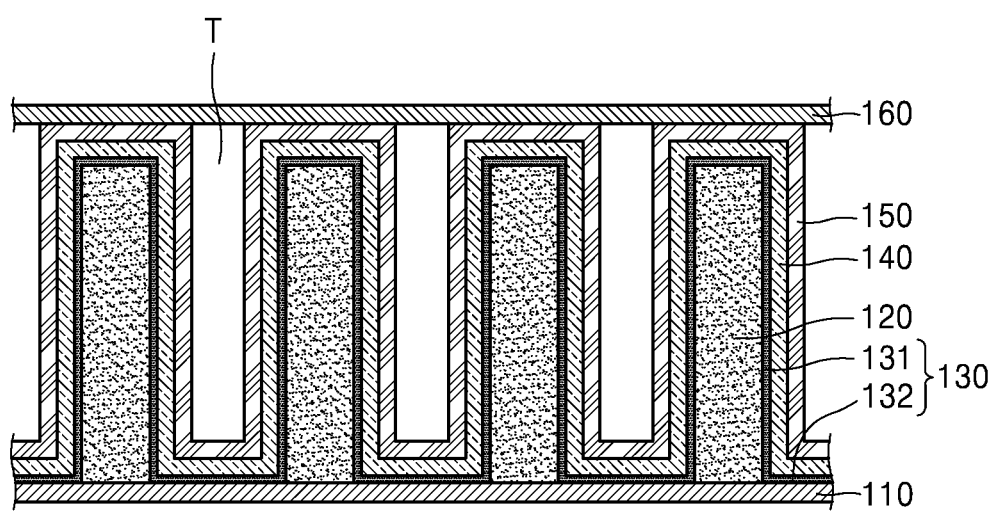

Referring to FIG. 3D, the anode 150 may be formed on the solid state electrolyte layer 140. The anode 150 may be formed by sputtering or thermally evaporating lithium. The anode 150 may have a thickness in a range from about 50 nm to about 1 μm.

An anode current collector 160 is disposed on the anode 150. The anode current collector 160 may be in the form of a foil. The anode current collector 160 may have a thickness of approximately 2 μm, e.g., 0.5 μm to 5 μm. Trenches T are formed between the anode 150 and the anode current collector 160, and the trenches T may be used as spaces for expansion of the 3D all-solid-state lithium ion battery 100.

However, the disclosed embodiment is not limited thereto. For example, the heat treatment may be performed after depositing the solid state electrolyte layer 140.

In the embodiment described above, the cathode protection layer 130 is a metal oxide, but the current embodiment is not limited thereto. For example, the cathode protection layer 130 and the solid state electrolyte layer 140 may include the same material. In this case, the cathode protection layer 130 may be formed to have a thickness in a range from about 0.1 μm about 0.5 μm by using a sputtering process, and the solid state electrolyte layer 140 may be formed to have a thickness in a range from about 0.5 μm to about 1 μm by using a CVD process. When the cathode protection layer 130 is formed by a sputtering process, the manufacturing time may be reduced, and also, the heat treatment process for forming the solid solution may be omitted.

FIGS. 4A through 4D are cross-sectional views illustrating a method of manufacturing the 3D all-solid-state lithium ion battery 200 including the cathode protection layer 230 according to another embodiment. Like reference numerals are used for elements that are substantially identical to the elements of the 3D all-solid-state lithium ion battery 200, and the descriptions thereof will not be repeated.

The cathode 220 is disposed on the cathode current collector 110. The cathode 220 may include only a cathode active material. The cathodes 220 may be formed by sintering a cathode-forming material including cathode active material powder, a binder, and a plasticizer. In the process of sintering the cathode-forming material, the binder and the plasticizer may be evaporated, and accordingly, the cathode 120 including only the cathode active material may be obtained. The cathode 120 may include a base unit 221 and a plurality of plates 222 vertically formed on the base unit 221.

The base unit 221 and the plates 222 of the cathode 120 may have a thickness in a range from about 5 μm to about 30 μm.

Figure 4A:
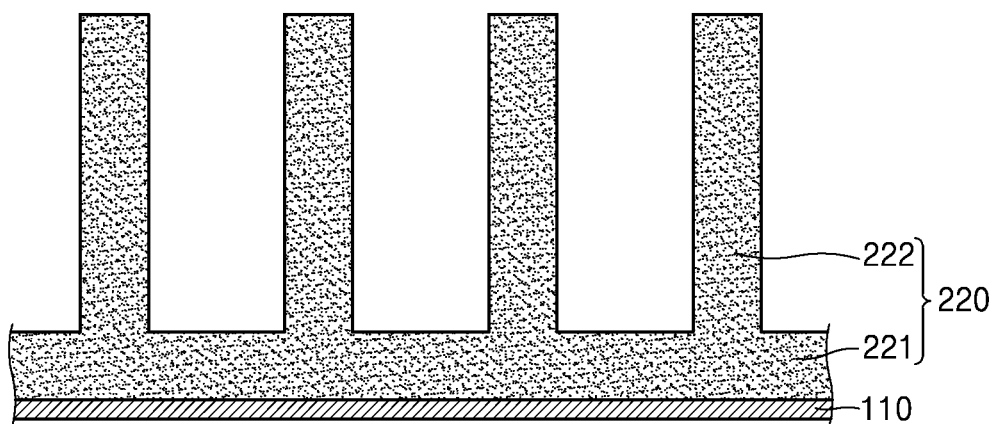
FIGS. 4A through 4D are cross-sectional views illustrating an embodiment of a method of manufacturing a 3D all-solid-state lithium ion battery including a cathode protection layer.
Figure 4B:
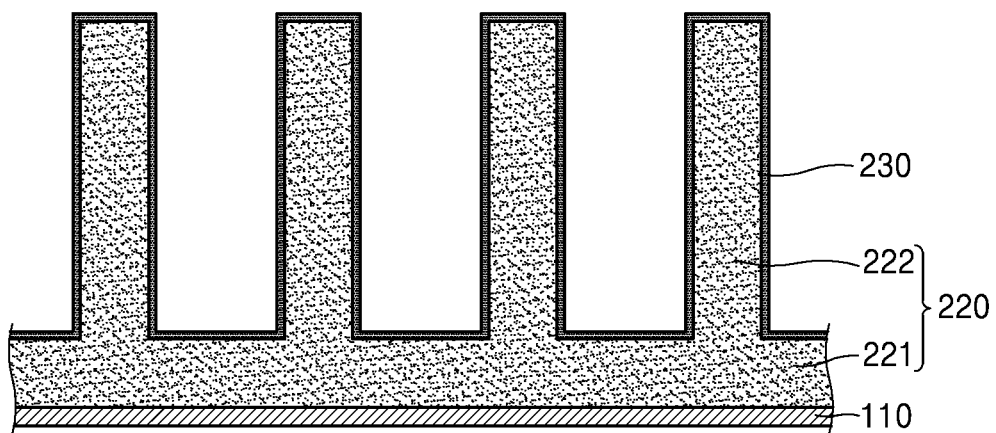

Referring to FIG. 4B, the cathode protection layer 230 is deposited on the cathode current collector 110 to cover the cathode 220. The cathode protection layer 230 may be formed by an ALD process. The cathode protection layer 230 may include a metal oxide including Al, Si, Ti, Zr, Sn, Mg, Ca, or a combination thereof. The cathode protection layer 230 may have a thickness in a range from about 3 nm to about 20 nm.

Figure 4C:
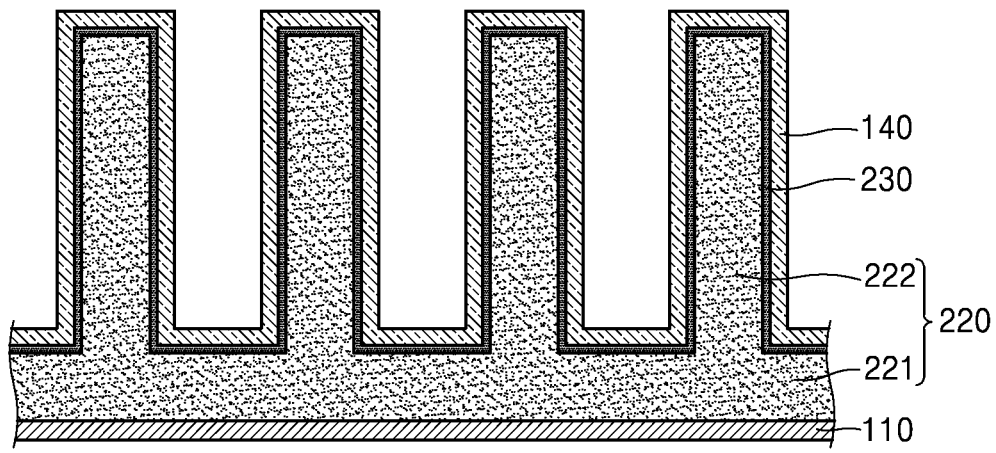

Referring to FIG. 4C, the solid state electrolyte layer 140 is formed on the cathode protection layer 230. The solid state electrolyte layer 140 may be formed by a CVD process or an ALD process to a thickness in a range from about 0.5 μm to about 1 μm. The solid state electrolyte layer 140 may include an oxide group lithium ion conductor or a sulfide group lithium ion conductor.

Next, the resultant product is heat treated. For example, if the resultant product is heat treated for 5 hours at a temperature of 450° C., the cathode protection layer 130 in contact with the cathode 220 may form a solid solution by a reaction with a surface of the cathode 220. If the cathode 220 includes $LiCoO_2$ and the cathode protection layer 230 includes $Al_2O_3$, the solid solution may be $LiCo_{1-x}Al_xO_2$. The whole cathode protection layer 230 or some portion of the cathode protection layer 230 may become the solid solution. In the process of heat treatment, the surface of the cathode 220 may also become a solid solution.

Figure 4D:
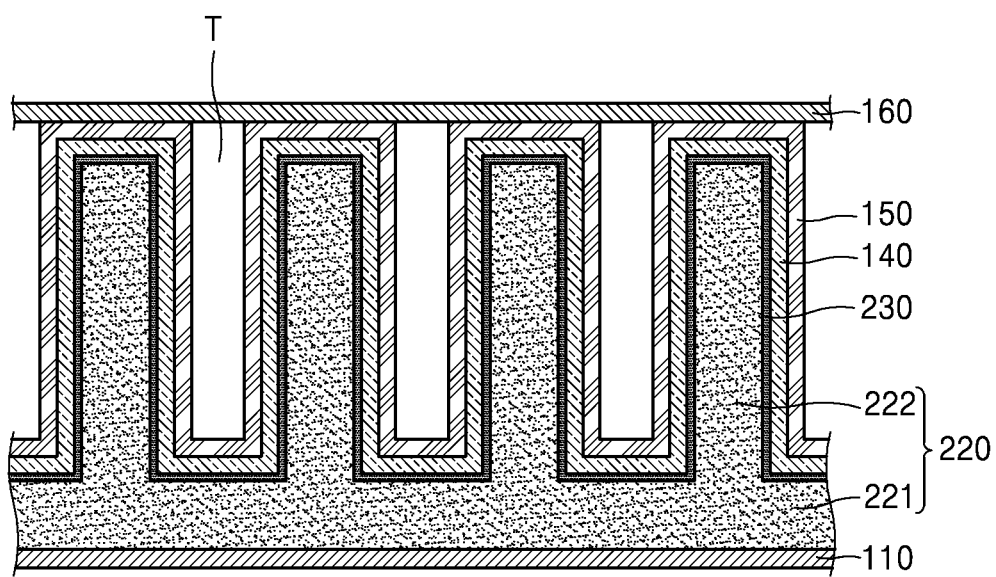

Referring to FIG. 4D, the anode 150 may be formed on the solid state electrolyte layer 140. The anode 150 may be formed by sputtering or thermally evaporating lithium. The anode 150 may have a thickness in a range from about 50 nm to about 1 μm.

The anode current collector 160 is disposed on the anode 150. The anode current collector 160 may be a foil and may have a thickness of approximately 2 μm. Trenches T are formed between the anode 150 and the anode current collector 160, and the trenches T may be used as spaces for expansion of the 3D all-solid-state lithium ion battery 200.

The current embodiment is not limited thereto. For example, the heat treatment may be performed before depositing the solid state electrolyte layer 140.

In the embodiment described above, the cathode protection layer 130 includes a metal oxide. However, the current embodiment is not limited thereto. For example, the cathode protection layer 230 may include the same material as the solid state electrolyte layer 140. In this case, the cathode protection layer 230 may be formed to have a thickness in a range from about 0.1 μm about 0.5 μm by using a sputtering process, and the solid state electrolyte layer 140 may be formed to have a thickness in a range from about 0.5 μm to about 1 μm by using a CVD process. When the cathode protection layer 230 is formed by a sputtering process, the manufacturing time may be reduced, and also, the heat treatment process for forming the solid solution may be omitted.

In a process of manufacturing a 3D all-solid-state lithium ion battery according to the disclosed embodiment, and while not wanting to be bound by theory, it is understood that a cathode protection layer prevents lithium from moving from a cathode to a solid state electrolyte layer when depositing the solid state electrolyte layer. Therefore, the performance of the 3D all-solid-state lithium ion battery is increased, and the also, the lifetime of the 3D all-solid-state lithium ion battery is increased.

While one or more embodiments have been described with reference to the figures, it will be understood by those of ordinary skill in the art that various changes in form and details may be made therein without departing from the spirit and scope as defined by the following claims.

What is claimed is:

1. An all-solid-state lithium ion battery including a cathode protection layer, the battery comprising:
   a cathode comprising a cathode active material disposed on a cathode current collector;
   a cathode protection layer disposed on a surface of the cathode and on the cathode current collector;
   a solid state electrolyte layer disposed on the cathode protection layer;
   an anode disposed on the solid state electrolyte layer; and
   an anode current collector disposed on the anode,
   wherein the cathode protection layer is between the cathode and the solid state electrolyte layer, and
   wherein the solid state electrolyte layer is between the cathode protection layer and the anode, and
   wherein the cathode protection layer comprises a metal oxide comprising Al, Si, Ti, Zr, Sn, Mg, Ca, or a combination thereof.

2. The all-solid-state lithium ion battery of claim 1, wherein the cathode protection layer comprises a first portion contacting a surface of the cathode, and wherein the first portion comprises a solid solution which is a reaction product of the cathode protection layer and the surface of the cathode.

3. The all-solid-state lithium ion battery of claim 1, wherein the cathode protection layer has a thickness in a range from about 3 nanometers to about 20 nanometers.

4. The all-solid-state lithium ion battery of claim 1, wherein the solid state electrolyte layer comprises an oxide group lithium ion conductor or a sulfide group lithium ion conductor.

5. The all-solid-state lithium ion battery of claim 1, wherein the cathode protection layer comprises a same material as the solid state electrolyte layer.

6. The all-solid-state lithium ion battery of claim 5, wherein the cathode protection layer is a product of a sputtering process, and
   wherein the solid state electrolyte layer is a product of a chemical vapor deposition process.

7. The all-solid-state lithium ion battery of claim 6, wherein the cathode protection layer has a thickness in a range from about 0.1 micrometer to about 0.5 micrometer.

8. The all-solid-state lithium ion battery of claim 1, wherein the cathode comprises $LiCoO_2$, $LiMnO_2$, $LiNiO_2$, $LiFePO_4$, $LiMnPO_4$, $LiMn_2O_4$, $Li(Ni_xCo_yAl_z)O_2$ wherein $x+y+z=1$, $Li(Ni_xCo_yMn_z)O_2$ wherein $x+y+z=1$, or a combination thereof.

9. A method of manufacturing an all-solid-state lithium ion battery comprising a cathode protection layer, the method comprising:
   disposing a cathode on an upper surface of a cathode current collector, the cathode comprising a cathode active material;
   forming the cathode protection layer on the cathode current collector to cover the cathode;
   forming a solid state electrolyte layer covering the cathode protection layer;
   forming an anode covering the solid state electrolyte layer; and
   forming an anode current collector on the anode to manufacture the all-solid state lithium ion battery comprising the cathode protection layer,
   wherein the cathode protection layer is between the cathode and the solid state electrolyte layer,
   wherein the solid state electrolyte layer is between the cathode protection layer and the anode, and
   wherein the cathode protection layer comprises a metal oxide comprising Al, Si, Ti, Zr, Sn, Mg, Ca, or a combination thereof.

10. The method of claim 9, wherein the forming of the cathode protection layer comprises heat treating the cathode protection layer to form a solid solution by a reaction between a region of the cathode protection layer that is in contact with the cathode and a surface of the cathode.

11. The method of claim 9, wherein the forming of the cathode protection layer comprises forming the cathode protection layer having a thickness in a range from about 3 nanometers to about 20 nanometers by atomic layer deposition.

12. The method of claim 9, wherein the solid state electrolyte layer comprises an oxide group lithium ion conductor or a sulfide group lithium ion conductor.

13. The method of claim 9, wherein the cathode protection layer comprises a same material as the solid state electrolyte layer.

14. The method of claim 13, wherein the cathode protection layer is formed by a sputtering process and the solid state electrolyte layer is formed by a chemical vapor deposition process.

15. The method of claim 14, wherein the cathode protection layer has a thickness in a range from about 0.1 micrometer to about 0.5 micrometer.

16. The method of claim 9, wherein the cathode comprises $LiCoO_2$, $LiMnO_2$, $LiNiO_2$, $LiFePO_4$, $LiMnPO_4$, $LiMn_2O_4$, $Li(Ni_xCo_yAl_z)O_2$ wherein $x+y+z=1$, $Li(Ni_xCo_yMn_z)O_2$ wherein $x+y+z=1$, or a combination thereof.

\* \* \* \* \*